US010847909B2

(12) United States Patent
So

(10) Patent No.: US 10,847,909 B2
(45) Date of Patent: Nov. 24, 2020

(54) DATA STORAGE DEVICES AND CONNECTORS FOR SAME

(71) Applicant: WESTERN DIGITAL TECHNOLOGIES, INC., San Jose, CA (US)

(72) Inventor: Kin Ming So, Hong Kong (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/282,068

(22) Filed: Feb. 21, 2019

(65) Prior Publication Data

US 2020/0274272 A1   Aug. 27, 2020

(51) Int. Cl.
| H01R 12/00 | (2006.01) |
| H01R 12/71 | (2011.01) |
| H01R 12/57 | (2011.01) |
| H01R 43/20 | (2006.01) |
| H05K 5/00 | (2006.01) |
| H05K 7/20 | (2006.01) |

(Continued)

(52) U.S. Cl.
CPC ........... *H01R 12/716* (2013.01); *H01R 12/57* (2013.01); *H01R 43/205* (2013.01); *H05K 5/0069* (2013.01); *H05K 5/0091* (2013.01); *H05K 7/20436* (2013.01); *H01R 24/60* (2013.01); *H01R 2107/00* (2013.01); *H05K 5/0052* (2013.01)

(58) Field of Classification Search
CPC .... H01R 12/716; H01R 12/57; H01R 43/205; H01R 24/60; H01R 13/502; H05K 7/20436; H05K 5/0069; H05K 5/0091; H05K 5/0052; G06F 1/1632; G06K 19/07741

USPC .......................................................... 439/78
See application file for complete search history.

(56) References Cited

U.S. PATENT DOCUMENTS 8,801,467 B2    8/2014  Lan
9,202,089 B2   12/2015  Yang et al.
9,471,104 B2   10/2016  Chiu et al.
(Continued)

FOREIGN PATENT DOCUMENTS

| CN | 203849999 U | 9/2014 | |
| CN | 106025618 A | 10/2016 | |
| JP | 2012094695 A | * 9/2012 | ............... H05K 7/20 |

OTHER PUBLICATIONS

U.S. Appl. No. 16/457,134, filed Jun. 28, 2019, So.
(Continued)

*Primary Examiner* — Jean F Duverne
(74) *Attorney, Agent, or Firm* — Brinks Gilson & Lione

(57) ABSTRACT

This disclosure relates to a storage device having a small form factor. The storage device can include a circuit board configured to store data. The circuit board can be enclosed in a housing. The storage device can include a connector mounted perpendicularly to an inner surface of the circuit board and extending through an aperture of an inner surface of the housing. The connector may be configured to electrically connect to an electronic device to transfer data between the storage device and the electronic device. The connector may be a universal serial bus (USB) Type-C connector. The storage device may have a thickness, measured between the inner surface of the housing and an outer surface of the housing, that does not exceed 6 millimeters (mm), for example.

22 Claims, 8 Drawing Sheets

(51) Int. Cl.
*H01R 24/60* (2011.01)
*H01R 107/00* (2006.01)

(56) References Cited

U.S. PATENT DOCUMENTS

| | | | |
|---|---|---|---|
| 9,577,382 B2 | 2/2017 | Kida | |
| 2009/0165294 A1 | 7/2009 | Upadhyayula et al. | |
| 2009/0190277 A1* | 7/2009 | Hiew | G06F 1/1632 |
| | | | 361/56 |
| 2013/0109235 A1 | 5/2013 | Chou et al. | |
| 2013/0118783 A1 | 5/2013 | Huang | |
| 2015/0016080 A1 | 1/2015 | Lung et al. | |
| 2015/0043149 A1* | 2/2015 | Chou | G06K 19/07741 |
| | | | 361/679.32 |
| 2016/0294101 A1* | 10/2016 | Kao | H01R 13/502 |
| 2018/0157891 A1 | 6/2018 | Wang et al. | |

OTHER PUBLICATIONS

"DX07 Series" I/O Connector Compatible with the Next Generation USB Type-C™ Specification Has Been Developed. JAE. https://www.jae.com/en/releasesE/news-201504DX07-en.html. Downloaded Jan. 10, 2018.

GCT USB Type C Connector. https://gct.co/usb-connector/usb-type-c. Downloaded Jan. 10, 2018.

GCT USB4065—Type C USB 3.1 Connector. https://gct.co/connector/usb4065#.WlakevmnFpg. Downloaded Jan. 10, 2018.

Kycon. Universal Serial Bus: KUSBVX-SMT Series USB Type C Socket, Vertical Mount, SMT Contacts. http://www.kycon.com/2013Catalogpage/USB/KUSBVX-SMT.pdf.

GCT Micro USB Connector (USB2.0). Micro USB Connector 2.0 Mount Types—Vertical, Horizontal: Top mount, mid mount and bottom mount. https://www.gct.co/usb-connector/micro-usb-connector-overview. Downloaded on Jan. 10, 2018.

MPSI USB Connectors. http://mpsiconnex.com/index.php/products-services/connectors/usb-connectors/. MPSI Connex. MPSi Limited. Downloaded Jan. 10, 2018.

USB Type-C Connector "DX07 Slim Plug" Has Been Developed. JAE electronics. https://www.jae.com/en/releasesE/news-201512DX07slimplug-en.html. Downloaded Jan. 10, 2018.

Variation of USB Type-C DX07 Series Connectors Has Been Expanded. JAE. https://www.jae.com/en/releasesE/news-201702DX07-en.html. Downloaded Jan. 10, 2018.

Wurth Elektronik Right Angle USB 3.1 Type C USB Connector Receptacle Surface Mount, Through Hole. https://za.rs-online.com/web/p/connettori-usb-tipo-c/1225151/ Downloaded Jan. 10, 2018.

International Search Report and Written Opinion in Application No. PCT/US2019/067664, dated Apr. 7, 2020, 10 pages.

* cited by examiner

DATA STORAGE DEVICES AND CONNECTORS FOR SAME

BACKGROUND

Field

This disclosure relates to storage devices and connectors for the same. In particular, this disclosure relates to data storage devices and connectors for the same having a low profile or small form factor.

Description

Data storage devices, such as portable data storage devices, are available in a variety of shapes and sizes. For example, larger data storage devices can include portable hard disk drives or solid state drives, and smaller data storage devices can include flash drives.

Typically, data storage devices include a connector adapted to allow the data storage device to be connected to a port of another device, such as a computer, laptop, smartphone, etc. In general, different types of connectors are available for connecting to different types of ports.

SUMMARY

The present disclosure generally relates to, for example, a type-C USB (Universal Serial Bus) memory drive or storage device with a small size. The storage device can be configured for plug and stay use. The storage device can include a USB type-C connector with leads extending along the direction of insertion of the storage device, and a USB SiP (System-In-Package) or other type of circuit board positioned within a housing.

In a first aspect, a storage device is disclosed. The storage device includes a circuit board configured to store data. The circuit board including an inner surface. The storage device includes a housing enclosing the circuit board. The housing includes an inner surface and an outer surface. The outer surface is opposite the inner surface of the housing. The inner surface of the circuit board is at least partially between the inner and outer surfaces of the housing. Both the inner and outer surfaces of the housing face outwardly away from the circuit board. The storage device also includes a connector mounted perpendicularly to the inner surface of the circuit board and extending through an aperture of the inner surface of the housing. The connector is configured to electrically connect to an electronic device to transfer data between the storage device and the electronic device. A thickness of the housing, measured between the inner surface of the housing and the outer surface of the housing, does not exceed 6 millimeters (mm).

In some embodiments, the storage device may include one or more of the following features, in any combination: (a) wherein the circuit board comprises a system-in-package (SiP); (b) wherein a thickness measured between the inner surface of the circuit board and an opposite outer surface of the circuit board does not exceed 2 mm, a width of the circuit board does not exceed 12 mm, and a length of the circuit board does not exceed 15 mm; (c) wherein the thickness of the circuit board is about 1.1 mm, the width of the circuit board is between about 7 mm and about 9 mm, and the length of the circuit board is between about 12 mm and about 13 mm; (d) wherein a width of the housing does not exceed 14 mm, and a length of the housing does not exceed 18 mm, (e) wherein the thickness of the housing is about 4.3 mm, the width of the housing is about 11.7 mm, and the length of the housing is about 14.5 mm; (f) wherein the connector is mounted flushly to the inner surface of the circuit board, and no portion of the connector extends into or through the circuit board; (g) wherein the housing comprises an inner housing member including the inner surface of the housing and the aperture such that the inner housing member at least partially surrounds the connector extending through the aperture; (h) wherein the inner housing member comprises a heat conductive material configured to transfer heat, and an outer housing member including the outer surface of the housing; (i) wherein the outer housing member comprises a heat insulative material configured to mitigate heat transfer relative to the heat conductive material; (j) wherein the inner housing member is configured to directly contact a surface of the electronic device with the connector electrically connected to the electronic device to provide heat transfer between the inner housing member and the electronic device; and/or (k) wherein the connector comprises a universal serial bus (USB) type-C connector.

In another aspect, a method for manufacturing a storage device is disclosed. The method includes mounting a connector to an inner surface of a circuit board such that the connector extends perpendicularly from the inner surface, and enclosing the circuit board within a housing comprising a heat conductive inner housing member and an outer housing member such that the connector extends through an inner surface of the inner housing member.

In some embodiments, the method includes one or more of the following features in any combination: (a) wherein mounting the connector comprises mounting the connector flushly to the inner surface of the circuit board such that no portion of the connector extends into or through the circuit board; (b) wherein mounting the connector comprises attaching mounting tabs of the connector to mounting points on the inner surface of the circuit board; (c) wherein mounting the connector comprises attaching lateral bodies of a base of the connector to mounting points on the inner surface of the circuit board; (d) wherein a thickness of the housing, measured between the inner surface of the housing and an outer surface of the housing, does not exceed 6 millimeters (mm); (e) wherein the circuit board comprises a system-in-package (SiP); (f) wherein the connector comprises a universal serial bus (USB) type-C connector; (g) wherein the outer housing member comprises a heat insulative material; and/or (h) attaching an insulating cover to an outer surface of the outer housing member.

In another aspect, a storage device is disclosed. The storage device includes a storing means for storing data, the storing means comprising an inner surface; a housing means for housing the storing means; and a connector means for connecting to an electronic device to transfer data between the storing means and the electronic device, the connector means mounted perpendicularly to the inner surface of the storing means by an attachment means, the connector means extending through an aperture of the housing means. A thickness of the housing means, measured between an inner surface of the housing means and an outer surface of the housing means, can be no more than 6 millimeters (mm).

In another aspect, a storage device is disclosed. The storage device includes a circuit board configured to store data. The circuit board includes an inner surface. The storage device includes a connector attached perpendicularly to the inner surface of the circuit board. The storage device includes a housing enclosing the circuit board. The housing includes an inner housing member proximate to an inner side of the circuit board including the inner surface of the circuit board, the inner housing member including an inner surface having an aperture formed therethrough, the connector extending through the aperture, the inner housing member comprising a heat conductive material configured to transfer heat. The housing also includes an outer housing member proximate to an outer side of the circuit board opposite the inner side, the outer housing member comprising a heat insulative material configured to mitigate heat transfer relative to the heat conductive material, the outer housing member connected to the inner housing to at least partially house the circuit board. The inner surface of the housing is configured to contact a surface of an electronic device with the storage device connected to the electronic device for the inner surface of housing to transfer heat between the housing and the electronic device.

In some embodiments, the storage device includes one or more of the following features in any combination: (a) wherein the heat conductive material comprises a zinc alloy; (b) wherein the heat insulative material comprises a thermoelastic polymer; (c) wherein the housing further comprises an insulating cover positioned on an outer surface of the outer housing member, the insulating cover comprising another heat insulative material that further mitigates heat transfer relative to the heat insulative material of the outer housing member; (d) wherein a thickness of the housing, measured between the inner surface of the housing and an outer surface of the housing is no more than 6 millimeters (mm); (e) wherein the circuit board comprises a system-in-package (SiP); (f) wherein the connector comprises a USB type-C connector; and/or (g) wherein the connector is mounted flushly to the inner surface of the circuit board and no portion of the connector extends into or through the circuit board.

BRIEF DESCRIPTION OF THE DRAWINGS

Various embodiments are depicted in the accompanying drawings for illustrative purposes, and should in no way be interpreted as limiting the scope of the inventions. The drawings may not be to scale.

DETAILED DESCRIPTION

Figure 1A:
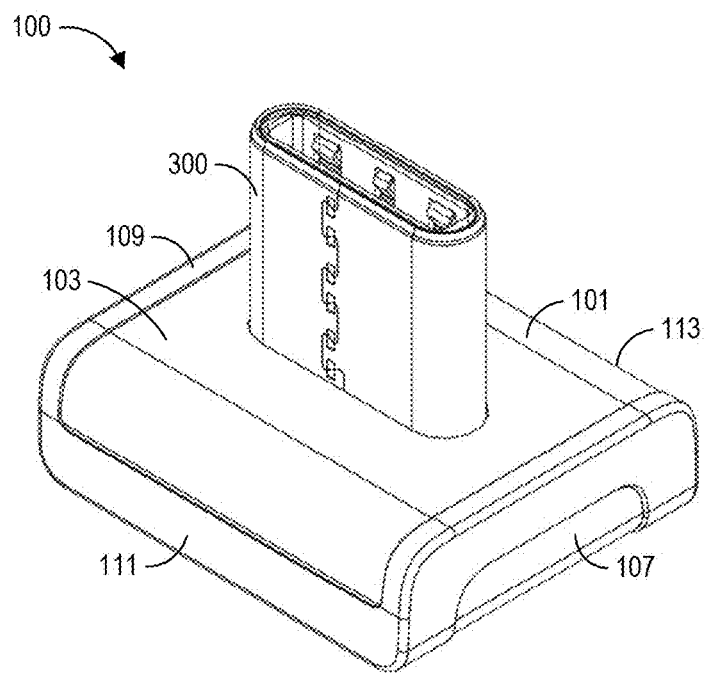
FIG. 1A is a first isometric view of an embodiment of a storage device.

This disclosure describes storage devices and connectors for the same. In the following detailed description, reference is made to the accompanying drawings. In the drawings, similar symbols typically identify similar components, unless context dictates otherwise. Thus, in some embodiments, part numbers can be used for similar components in multiple figures, or part numbers can vary from figure to figure. The illustrative embodiments described herein are not meant to be limiting. Other embodiments can be utilized, and other changes can be made, without departing from the spirit or scope of the subject matter presented. It will be readily understood that the aspects of the present disclosure and illustrated in the figures, can be arranged, substituted, combined, and designed in a wide variety of different configurations by a person of ordinary skill in the art, all of which are made part of this disclosure.

Reference throughout this disclosure to "one embodiment," "an embodiment," or "in some embodiments" means that a particular feature, structure, or characteristic described in connection with the embodiment is included in at least one embodiment. Moreover, the appearance of these or similar phrases throughout the specification does not necessarily all refer to the same embodiment, nor are separate or alternative embodiments necessarily mutually exclusive. Various features are described herein which can be exhibited by some embodiments and not by others.

Figure 1B:
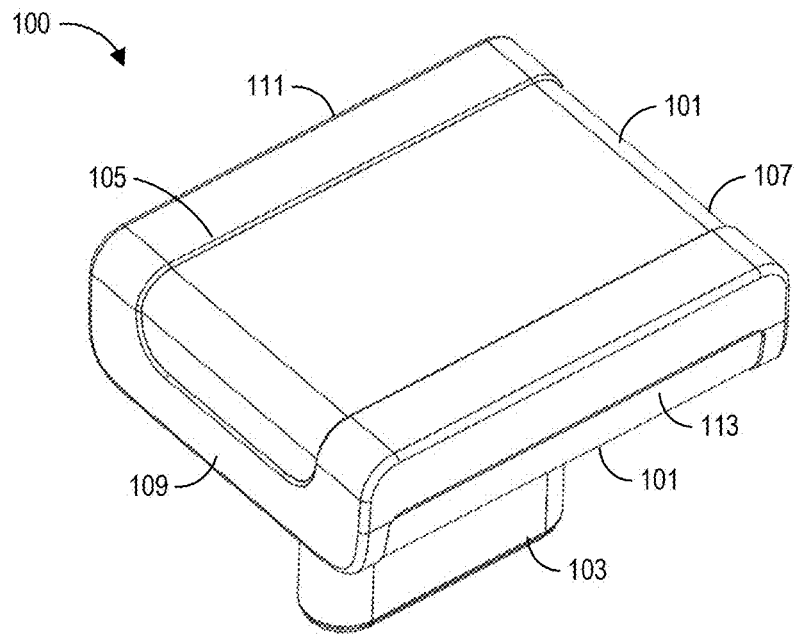
FIG. 1B is a second isometric view of the storage device of FIG. 1A.
Figure 1C:
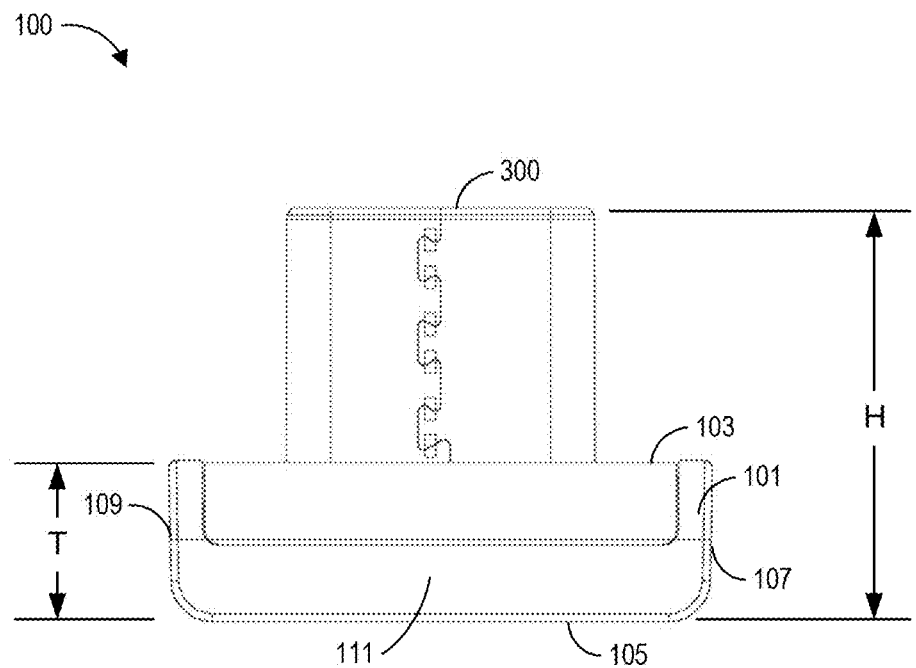
FIG. 1C is a top side view of the storage device of FIG. 1A.
Figure 1D:
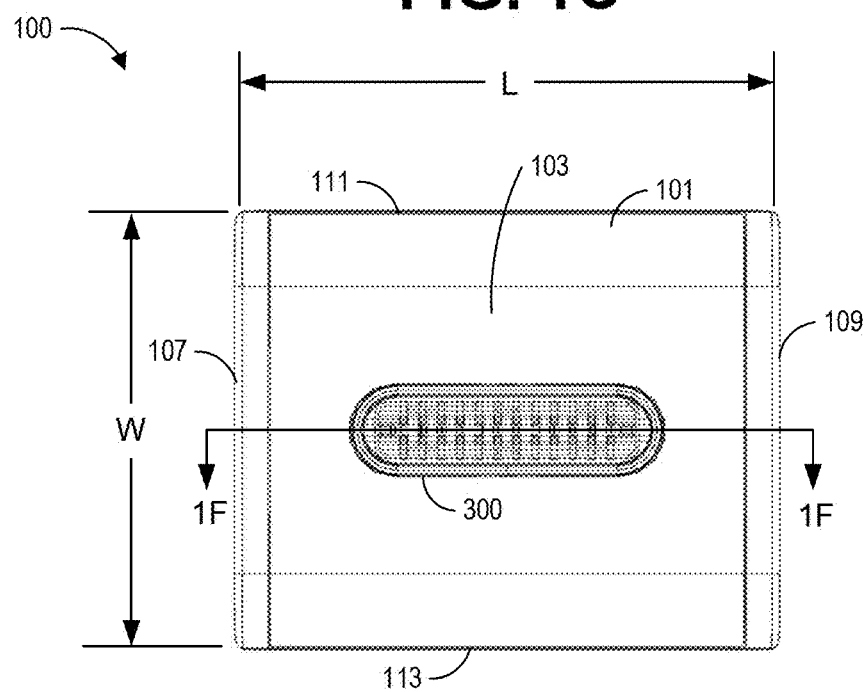
FIG. 1D is an inner side view of the storage device of FIG. 1A.
Figure 1E:
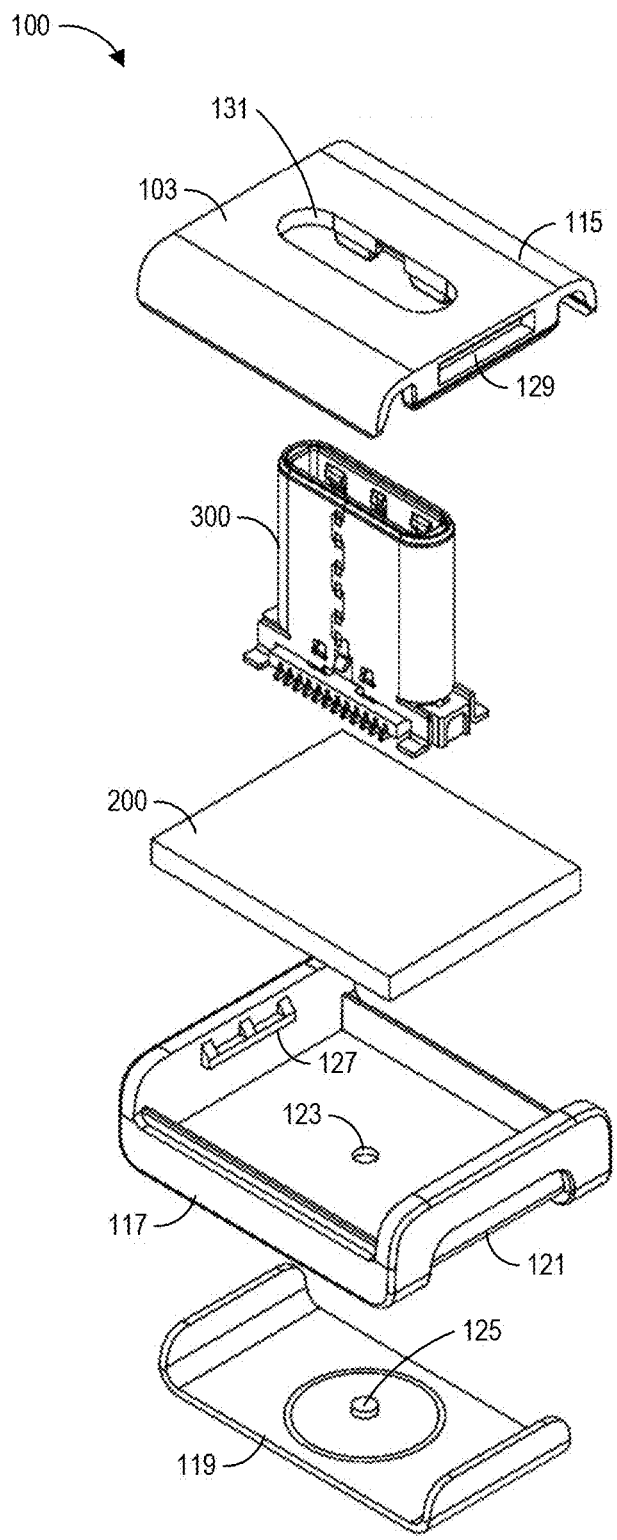
FIG. 1E is an exploded isometric view of the storage device of FIG. 1A.
Figure 1F:
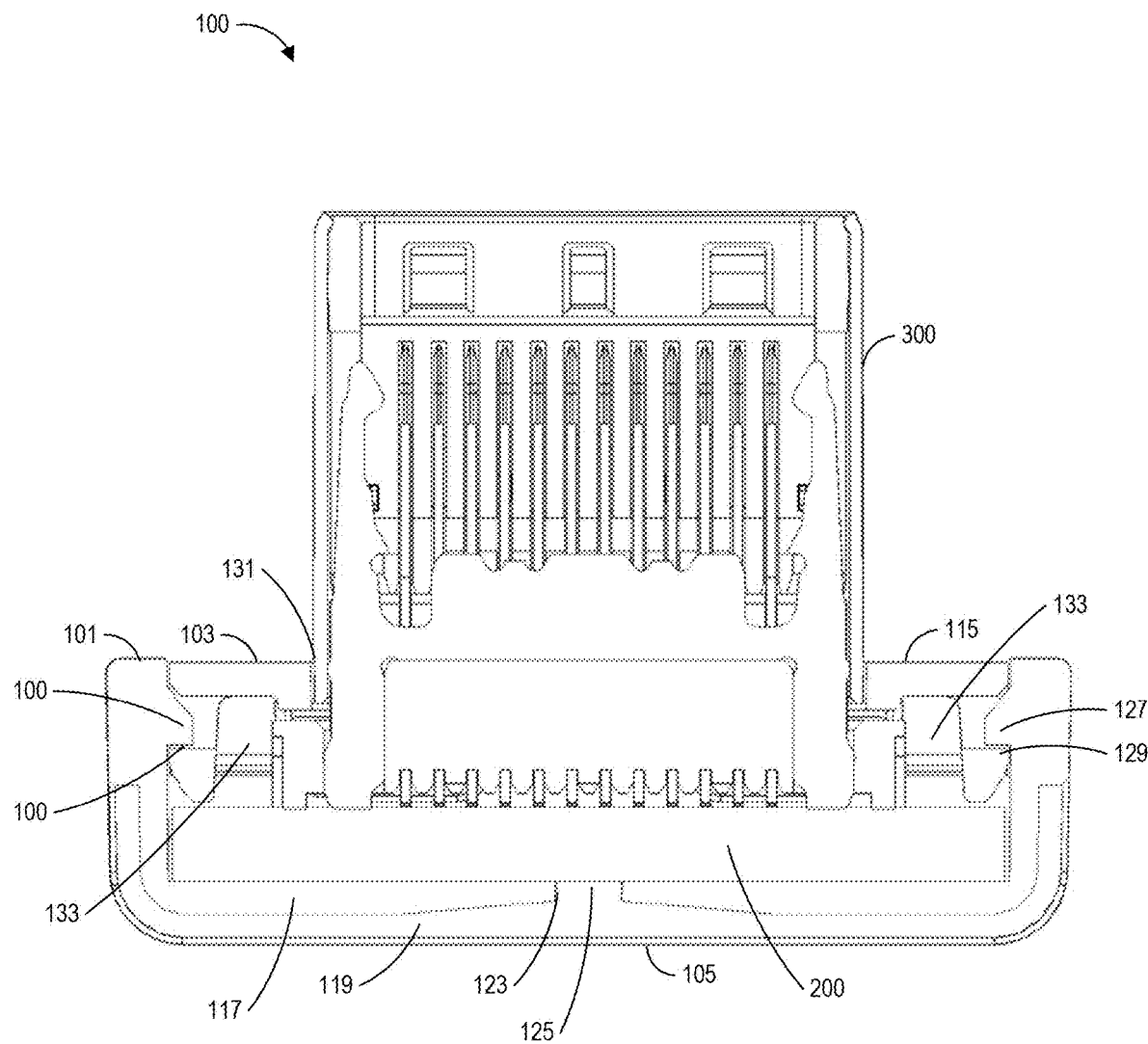
FIG. 1F is a cross-sectional view of the storage device of FIG. 1A taken along the line illustrated in FIG. 1D.

FIGS. 1A-1F illustrate views of an embodiment of a storage device 100. FIGS. 1A and 1B are first and second isometric views, respectively. FIG. 10 is a top side view, and FIG. 1D is an inner side view. FIG. 1E is an exploded isometric view, and FIG. 1F is a cross-sectional view of the storage device 100 taken along the line illustrated in FIG. 1D.

The storage device 100 can be a data storage device configured for the storage of data, such as computer files. The storage device 100 can be a portable storage device. As will be described below, the storage device 100 is connectable to an electronic device (e.g., a desktop computer, a laptop computer, a tablet, a cellphone, an mp3 player, etc.) via a connector 300. A user may then transfer data between the storage device 100 and the electronic device. The storage device 100 can be used, for example, to provide data storage, to provide additional storage for the electronic device, or to transfer data between two or more electronic devices. Other uses for the storage device 100 are also possible.

As will be described below, the storage device 100 can be configured with a small (or low-profile) form factor (or size). Example dimensions for the storage device 100 configured with small or low-profile form factors are described in detail below with reference to FIGS. 10 and 1D. Configuring the storage device 100 to have a small form factor may provide a number of advantages.

For example, when connected to an electronic device (e.g., when connected to a port of an electronic device), the degree to which the storage device 100 protrudes from the side of the electronic device can be limited. This may allow a user to leave the storage device 100 connected to (e.g., plugged into, attached to, etc.) the electronic device for an extended period of time.

Many conventional storage devices protrude significantly from the sides of electronic devices to which they are attached. As a result, many users only connect conventional storage devices to electronic devices for short periods of time because the protrusion of the storage devices from the electronic devices can be awkward or unwieldy. For example, a user may generally connect a conventional storage device to an electronic device to transfer data to or from the conventional storage device and then may remove the conventional storage device when the data transfer is complete. Further, many users generally disconnect conventional storage devices from electronic devices before storing the electronic storage devices, for example, to enable the electronic storage device to fit within a case or bag or to protect the storage device. For example, a user may remove a conventional storage device from a laptop before placing the laptop into a laptop bag or backpack because, otherwise, the laptop may not fit within the bag or backpack or the protruding conventional storage device may be damaged during storage.

The storage device 100 described herein can be configured with a small or low-profile form factor that may alleviate one or more of these disadvantages of conventional storage devices. For example, the storage device 100 may not protrude significantly from the side of an electronic device to which it is attached. This may allow a user to leave the storage device 100 connected to the electronic device for extended periods of time or during storage of the electronic device. For example, a user may leave the storage device 100 connected to an electronic device continuously because the small form factor of the storage device 100 may not significantly interfere with the use of the electronic device when connected.

Another advantage of the small form factor of the storage device 100 may be that, when the storage device 100 is not connected to any other device, it may not require much space for storage. For example, a user may desire to carry the storage device 100 in his or her pocket or bag. As such, a small form factor for the storage device 100 may be desirable as it will not require much space for storage.

Decreasing the size or form factor of the storage device 100, however, is not without technical difficulty. For example, as the size of the storage device 100 is decreased, it may become increasingly difficult to provide adequate heat dissipation for the storage device 100. As will be described in detail below, the storage device 100 can be configured to provide sufficient heat dissipation, even with the small form factor of the storage device 100. Thus, the storage device 100 can provide several advantages not achievable with conventional storage devices (e.g., providing a small form factor while capable of heat dissipation).

As shown in FIGS. 1A and 1B, the storage device 100 includes a housing 101. The housing 101 can be configured to enclose internal components of the storage device 100 (see, e.g., FIGS. 1E and 1F). As discussed in greater detail below, the housing 101 can be configured with a small or low-profile form factor and can also be configured to provide heat dissipation for the storage device 100.

As shown in FIG. 1A, the housing 101 includes an inner surface 103. The inner surface 103 may be configured to face toward an electronic device to which the storage device 100 is attached. In some embodiments, the inner surface 103 is configured to contact the electronic device to which the storage device 100 is attached. As illustrated, for some embodiments, the inner surface 103 can be configured to be flat or planar. This may facilitate contact with a side of the electronic device to which the storage device 100 is attached.

As shown in FIG. 1A, the connector 300 extends from the inner surface 103. The connector 300 can be configured for connection to an electronic device. For example, the connector 300 can be configured to connect to a port of the electronic device. In the illustrated embodiment, the connector 300 is a USB type-C connector. In other embodiments, however, the connector 300 can be configured as another type of connector. For example, in other embodiments, the connector 300 can be configured as a USB type-A connector, a USB type-B connector, a mini USB connector, a micro USB connector, a lightning connector, a thunderbolt connector, etc. In certain embodiments, a USB type-C connector (for example, as illustrated) may be preferred because use of a USB type-C may contribute to minimizing the small form factor of the storage device 100.

As shown in FIGS. 1A and 1B, in some embodiments, the housing 101 has a generally rectangular shape comprising the inner surface 103, an outer surface 105, a first side surface 107 (e.g., a right side surface), a second side surface 109 (e.g., a left side surface), a third side surface 111 (e.g., a top surface), and a fourth side surface 113 (e.g., a bottom surface). The outer surface 105 can be opposite the inner surface 103. The second side surface 109 can be opposite the first side surface 107. The fourth side surface 113 can be opposite the third side surface 111. In the illustrated embodiment, the outer surface 105, the first surface 107, the second surface 109, the third surface 111, and the fourth surface 113 are generally flat or planar. This, however, need not be the case in all embodiments. For example, one or more of the outer surface 105, the first surface 107, the second surface 109, the third surface 111, and the fourth surface 113 (and/or the inner surface 103) can comprise a non-flat or non-planar shape, such as a curved shape. Further, although the housing 101 has been illustrated with a generally rectangular shape in the figures, other shapes for the housing 101 are possible.

With reference to FIGS. 1C and 1D, the housing 101 may comprise a width W, a length L, and a thickness T as shown. The width W, the length L, and the thickness T dimensions described below are configured to provide the housing 101 and/or the storage device 100 with a small or low-profile form factor. Further, the storage device 100 may have a total height H as shown.

The thickness T can be measured between the inner surface 103 and the outer surface 105. As mentioned previously, in some embodiments, the storage device 100 is configured such that the inner surface 103 contacts an electronic device to which the storage device 100 is connected. Accordingly, the thickness T may define the distance that the housing 101 and/or the storage device 100 protrudes from an electronic device to which it is connected. In some embodiments, the thickness T may be about 8 mm, 6 mm, 5 mm, 4.5 mm, or 4.0 mm. In some embodiments, the thickness T may not exceed about 8 mm, 6 mm, 5 mm, 4.5 mm, or 4.0 mm. In some embodiments, the thickness T is between about 8.0 mm and 3 mm, between 6.0 mm and 3 mm, between 5.0 mm and 3 mm, between 4.5 mm and 3.5 mm, or between 4.5 mm and 3.5 mm. In an embodiment, the thickness T is about 4.3 mm. Thicknesses T as described above may provide one or more of the advantages mentioned previously. For example, thicknesses T as described above may allow a user to leave the storage device 100 connected to an electronic device because the protrusion of the storage device 100 from the electronic device is limited. As will be described below, the thickness T can be minimized, in some embodiments, by mounting the connector 300, such that it extends perpendicularly (also referred to as vertically) from the storage device 100 (e.g., as illustrated, the connector 300 extends perpendicularly from the inner surface 103).

As shown in FIG. 1D, the length L can be measured between the first surface 107 and the second surface 109 as shown. In some embodiments, the length L may be about 20 millimeters (mm), 18 mm, 16 mm, 14 mm, 12 mm, or 10 mm. In some embodiments, the length L may not exceed about 20 mm, 18 mm, 16 mm, 14 mm, 12 mm, or 10 mm. In some embodiments, the length L is between about 20 mm and 10 mm, between 18 mm and 12 mm, between 16 mm and 12 mm, between 15 mm and 13 mm, between 15 mm and 14 mm. In an embodiment, the length L is about 14.5 mm.

The width W can be measured between the third surface 111 and the fourth surface 113 as shown. In some embodiments, the width W may be about 15 mm, 14 mm, 13 mm, 12 mm, 11 mm, 10 mm, 9 mm, 8 mm, 7 mm, or 6 mm. In some embodiments, the width W may not exceed about 15 mm, 14 mm, 13 mm, 12 mm, 11 mm, 10 mm, 9 mm, 8 mm, 7 mm, or 6 mm. In some embodiments, the width W is between about 15 mm and 7 mm, between 13 mm and 9 mm, between 12 mm and 10 mm, or between 12 mm and 11 mm. In an embodiment, the width W is about 11.7 mm. Lengths L and widths W as described above can provide the above-described advantages.

Further, certain of the lengths L and widths W as described above are in accordance with USB type-C specifications, which specify minimum distances between adjacent USB type-C ports. For example, the USB type-C specifications indicate that adjacent ports be at least 12.85 mm apart (spaced laterally) and 7 mm apart (spaced vertically) measured from the center point of the ports. To ensure that storage devices do not overlap and block adjacent ports, the lengths and widths of the devices must be limited. For conventional storage devices, this has resulted in increased thicknesses that cause the conventional storage device to protrude significantly from the sides of electronic devices. The storage device 100, in some embodiments, however, is configured to maintain sufficiently small lengths L and widths W so as to not block adjacent ports, while also maintaining a reduced thickness T, which limits the extent to which the storage device 100 protrudes from an electronic device to which it is attached.

As mentioned previously, as the size of a storage device 100 decreases it may be difficult to provide sufficient heat dissipation. In some embodiments, the housing 101 is configured to provide adequate heat dissipation for the storage device 100, while still maintaining the small form factor according to the width W, length L, and thickness T dimensions described above.

In some embodiments, this may be achieved by configuring the housing 101 such that heat generated by the storage device 100 is transferred (e.g., conducted) to the body of the electronic device to which the storage device 100 is attached for dissipation. In most cases, the electronic device to which the storage device 100 is attached is much larger than the storage device 100 itself. As such, the electronic device includes a greater surface area from which to dissipate heat. Thus, by transferring heat from the storage device 100 to the electronic device, the storage device 100 (with its small form factor) may be configured to provide adequate heat dissipation. For example, by transferring heat to a connected electronic device, the storage device 100 may be capable of adequately dissipating heat generated during use at common USB 3.1 data transfer rates, i.e., 5 GB/s, 10 GB/s, etc.

In some embodiments, to achieve heat transfer to a connected electronic device, the housing 101 may comprise several components as illustrated in the exploded view of FIG. 1E. For example, the housing 101 may include an inner housing member 115 and an outer housing member 117. The inner housing member 115 can include the inner surface 103, which as mentioned previously, can contact the electronic device to which the storage device 100 is attached. The inner housing member 115 can be made from a material that is highly conductive of heat. For example, the inner housing member 115 can be made from metal. In certain examples, the inner housing member 115 is made from a zinc alloy.

The outer housing member 117 can be made from a heat insulative material. In some embodiments, the outer housing member 117 is made from a plastic material. For example, in some embodiments, the outer housing member 117 is made from a polycarbonate material. In some embodiments, a heat insulative tape, spacer, or cushion material can be included between an outer surface of a circuit board 200 and an inner surface of the outer housing member 117. This can provide improved heat insulation for the storage device 100 and/or can improve the durability of the device by, for example, acting as a cushion against forces imposed on the storage device 100 during drops or use.

The inner housing member 115 and the outer housing member 117 can be configured to be joined together to enclose the internal components of the storage device 100. For example, as shown in the exploded view of FIG. 1E and the cross-sectional view of FIG. 1F, the inner housing member 115 and the outer housing member 117 can be joined together to enclose the circuit board 200 of the storage device 100. The circuit board 200 can include the circuitry and other electronic components of the storage device 100. In some embodiments, the circuit board 200 is a system-in-package (SiP). Example circuit boards 200 for use with the storage device 100 are described in greater detail below with reference to FIGS. 2A-3. As shown in FIGS. 1E and 1F, the connector 300 extends (e.g., perpendicularly) from the circuit board 200. During use, the components of the circuit board 200 generate heat that should be dissipated.

As previously mentioned, the housing 101 can transfer the heat generated by the circuit board 200 to an electronic device to which the storage device 100 is connected. This can be achieved because the inner housing member 115, which faces and may contact the electronic device to which the storage device 100 is connected, is highly conductive of heat. Further, heat may be transferred from the circuit board 200 to the electronic device through the connector 300 (e.g., through contact of the body of the connector 300 or pins of the connector and the electronic device). Thus, in some embodiments, heat dissipation is achieved through the features of the housing 101, as discussed above, and/or through the connector 300.

At the same time, the outer housing member 117 can be heat insulative and/or a heat insulative tape, spacer, or cushion material can be included between an outer surface of the circuit board 200 and an inner surface of the outer housing member 117. This can provide two functions. First, the outer housing member 117 can direct heat towards the inner housing member 115 so that it can then be conducted to the electronic device to which the storage device 100 is connected. Second, the outer housing member 117 can also serve to limit the temperature of the outer portion of the storage device 100 so as to prevent or reduce the likelihood that the storage device 100 will burn a user.

To this end, the housing 101 may further include an additional cover 119 attached to the outer side of the outer housing member 117. The cover 119 can be an insulating cover. In some embodiments, the cover 119 is made from a thermoplastic elastomer (TPE) material. As illustrated in FIG. 1E, the outer housing member 117 may include a recess 121 configured in size and shape to receive the insulating cover 119. The outer housing member 117 may also include an opening 123 formed therethrough. The opening 123 may be configured to receive a corresponding protrusion 125 formed on an inner surface of the insulating cover 119. The opening 123 and protrusion 125 may be configured to align components during manufacture and/or secure the insulating cover 119 to the outer housing member 117.

In some embodiments, the inner housing member 115 and the outer housing member 117 may be configured for snap-fit engagement. For example, in the illustrated embodiment, the outer housing member 117 includes flanges 127 configured to engage openings or recesses 129 on the inner housing member 115. The flanges 127 and openings or recesses 129 can be configured in size, shape, and position for snap-fit engagement between the inner housing member 115 and the outer housing member 117. Other methods for joining the inner housing member 115 and the outer housing member 117 (e.g., adhesives, mechanical fasteners, friction fits, etc.) are also possible.

As shown in FIG. 1E, the inner housing member 115 can include an aperture 131 formed therethrough. The aperture 131 can be configured to receive the connector 300 therethrough, as shown, for example, in FIG. 1F. For example, the connector 300 can extend perpendicularly from the circuit board 200 and through the aperture 131 in the inner housing member 115.

FIG. 1F is a cross-sectional view of the storage device 100 taken along the line shown in FIG. 1D. As shown, for some embodiments, the circuit board 200 may be received within the housing 101. The circuit board 200 can be enclosed between the inner housing member 115 and the outer housing member 117. The connector 300 extends from the circuit board 200 (e.g., perpendicularly) and through the aperture 131 in the inner housing member 115. As illustrated, for some embodiments, the circuit board 200 can contact an inner surface of the outer housing member 117. The circuit board 200 can be spaced apart from an inner surface of the inner housing member 115, leaving an empty space 133 therebetween.

The total height H (see FIG. 10) for the storage device 100 (measured between the outer surface 105 and the distal end of the connector 300) can be, in some embodiments, about 15 mm, 13 mm, 11 mm, or 9 mm. In some embodiments, the height H may not exceed about 15 mm, 13 mm, 11 mm, or 9 mm. In some embodiments, the height H is between about 13 mm and about 9 mm, between about 12 mm and about 10 mm, or between about 11.5 mm and about 10.5 mm. In an embodiment, the height H is about 11 mm.

Figure 2A:
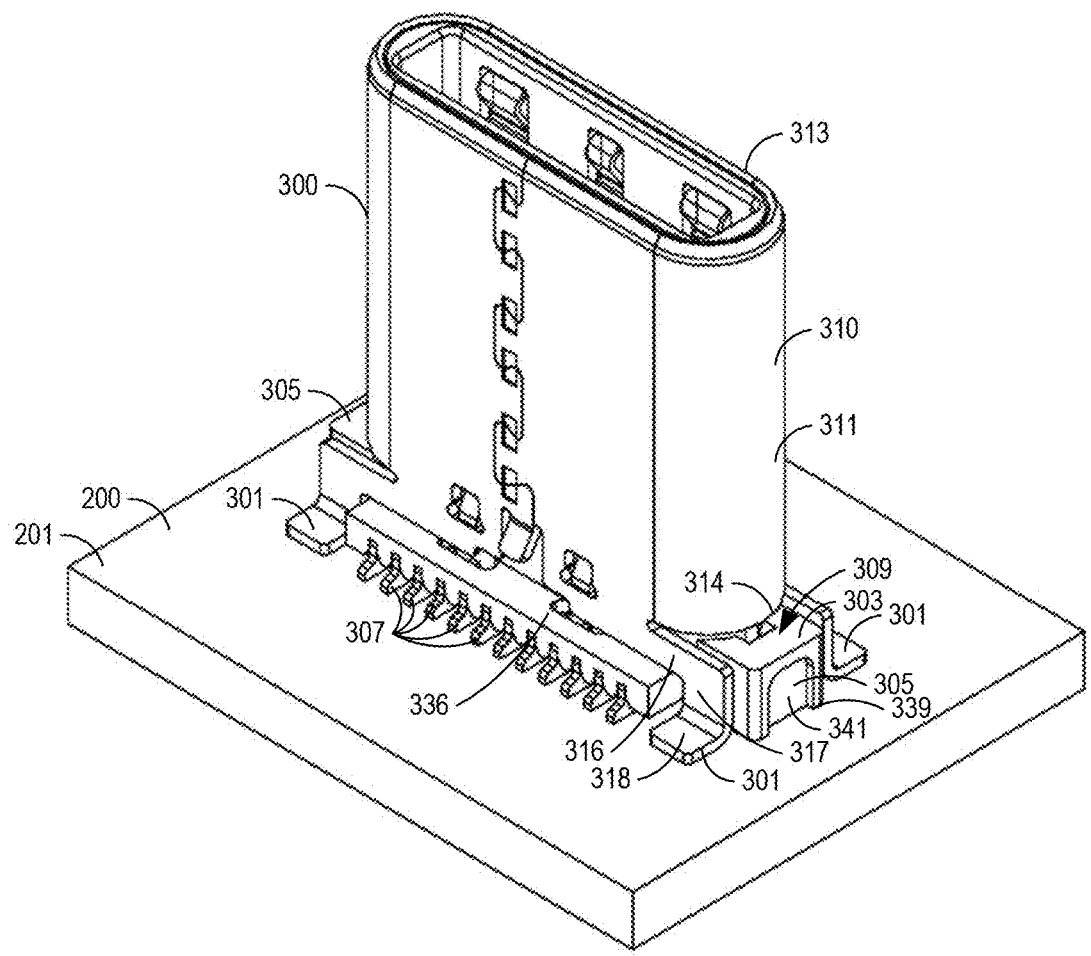
FIG. 2A is an isometric view of an embodiment of a connector mounted to an embodiment of a circuit board for the storage device of FIG. 1A, for example.
Figure 2B:
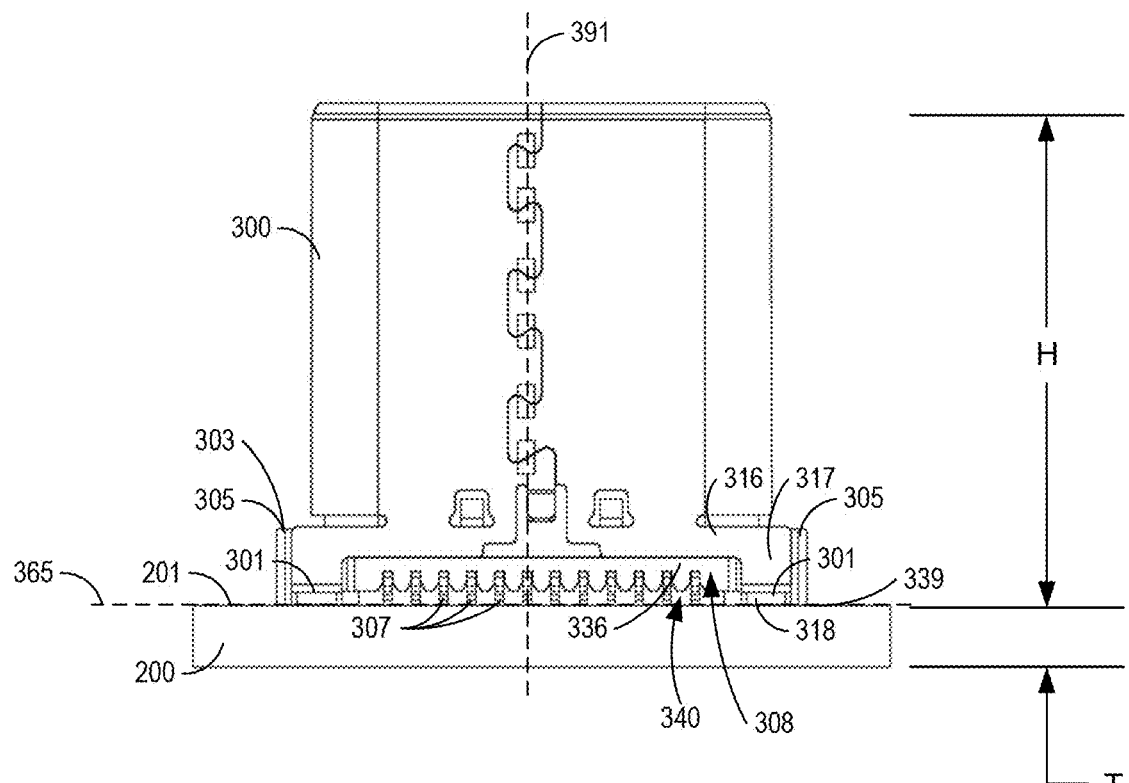
FIG. 2B is a top view of the connector and circuit board of FIG. 2A.
Figure 2C:
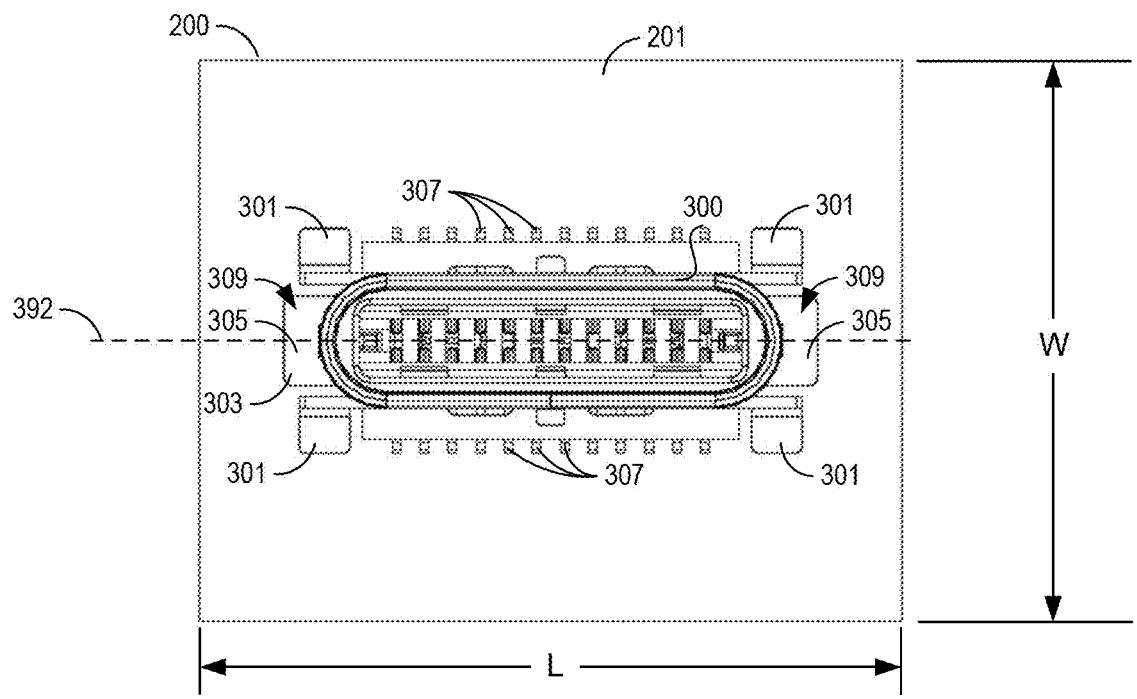
FIG. 2C is an inner side view of the connector and circuit board of FIG. 2A.

As mentioned briefly above, another mechanism for configuring the storage device 100 with a small form factor may be to mount the connector 300 in a perpendicular (or vertical) manner. This is described in greater detail below with reference to FIGS. 2A-2C, which illustrate various views of an embodiment of the connector 300 perpendicularly mounted to an embodiment of the circuit board 200 (i.e., FIGS. 2A-2C illustrate the connector 300 with the housing 101 removed). FIG. 2A is an isometric view, FIG. 2B is a top view, and FIG. 2C is a side view.

As before, in the illustrated embodiment, the connector 300 is a USB type-C connector. In other embodiments, however, the connector 300 can comprise other types of connectors. In certain embodiments, a USB type-C connector (for example, as illustrated) may be preferred because use of a USB type-C may contribute to minimizing the small form factor of the storage device 100.

The circuit board 200 can include the circuitry and other electronic components of the storage device 100. In some embodiments, the circuit board 200 is a system-in-package (SiP). A SiP can comprise a plurality of integrated circuits enclosed in a single module (or package). The SiP can perform all or most of the functions of the storage device 100 (e.g., reading, writing, and storing data). The SiP can include a plurality of dies containing integrated circuits. The dies may be stacked vertically on a substrate. The dies can be internally connected by fine wires that are bonded to the module. Alternatively, solder bumps can be used to join stacked dies together. In some embodiments, the dies can be stacked horizontally.

The circuit board 200 need not comprise a SiP in all embodiments. For example, in some embodiments, the circuit board 200 comprises a printed circuit board (PCB). In some embodiments, both a SiP and a PCB may be utilized. In certain embodiments, use of a SiP may be advantageous, as a SiP may provide an all-in-one small package which can be useful for decreasing the overall size or form factor of the storage device 100.

As shown in FIG. 2A, the circuit board 200 (a SiP, for example) includes an inner surface 201. The connector 300 (a USB type-C connector, for example) extends perpendicularly from the inner surface 201 of the circuit board 200. Further, the connector 300 can be mounted to the inner surface 201 of the circuit board 200.

In some embodiments, the connector 300 mounts flushly with the inner surface 201, such that components of the connector 300 do not extend through the inner surface 201 and into or through the circuit board 200. This may be the case where (as illustrated) the circuit board 200 comprises a SiP. In some embodiments, the SiP is configured such the connector 300 may be mounted to only a single side (e.g., the inner surface 201) thereof. Mounting the connector 300 perpendicularly and flushly to the inner surface 201 of the circuit board 200 may pose technical challenges as it can be difficult to provide a strong mechanical and electrical connection between the connector 300 and the circuit board 200. The connection must be sufficient to withstand normal forces and torques exerted on the storage device 100 as it is connected and/or disconnected from various electronic devices. For example, the connection between the connector 300 and the circuit board 200 must be sufficiently strong to withstand normal pushing, pulling, and bending like conventional storage devices. As will be described below, the connector 300 can be configured to provide a sufficiently strong connection between the circuit board 200 and the connector 300.

It will be appreciated that most conventional storage devices do not include perpendicularly mounted connectors. This is largely because of the difficulties in providing a secure connection between the connector and the circuit board. Rather, conventional storage devices generally include horizontally (e.g., parallelly) mounted connectors, which are either mounted to a surface of the board (e.g., horizontal on-board connectors, such as top or bottom mount connectors) or inset into the board (e.g., horizontal mid-mount connectors). Each of these conventional solutions can provide a strong mechanical connection between the connector and the board. The drawback to these conventional designs, however, is that, when the connector is horizontally mounted to the board, the overall thickness of the conventional storage devices is increased, leading to devices which, as described above disadvantageously protrude significantly when connected to other electronic devices.

A few conventional storage devices include perpendicularly mounted connectors. However, these connectors generally include mounting pins that extend through holes in the corresponding boards and attach to a back or outer side of the board. That is, these connectors generally do not mount flushly to the inner side of the board, and instead extend through the board to provide a sufficiently strong mechanical connection. These designs may not be possible with certain small form factor circuit boards, such as SiPs, which may not permit mounting pins to extend therethrough to, for example, mitigate or hinder the relatively small form factor designs discussed and disclosed herein.

In contrast with these conventional storage devices, certain embodiments of the storage device 100 described herein are configured such that the connector 300 mounts flushly to the inner surface 201 of the circuit board 200, while still providing a sufficiently strong mechanical and electrical connection between the connector 300 and the board 200 to, for example, help spread inward forces (e.g., moment forces) and mitigate against failure due to drop impacts.

For example, as illustrated in FIG. 2A, the connector 300 can include an outer shell 310 which includes a main body 311. The main body 311 can extend between a distal end 313 and a proximal end 314. The main body 311 can be configured in size and shape to fit within a port of an electronic device to which the connector 300 is configured to connect. In the illustrated embodiment (USB type-C connector), the main body 311 is configured with a generally oval shape extending between the distal end 313 and the proximal end 314.

The outer shell 310 of the connector 300 can include mounting tabs 301, as shown. In the illustrated embodiment of FIGS. 2A-2C, the connector includes four mounting tabs 301. Two of the mounting tabs 301 are positioned on a first side of the connector 300 and two of the mounting tabs 301 are positioned on a second side of the connector 300, opposite the first side. The mounting tabs 301 can be positioned, for example, generally at the four outer corners of the outer shell 310. Although four mounting tabs 301 are illustrated, other numbers and arrangements for the mounting tabs 301 are possible. For example, FIG. 4 (discussed below) illustrates an embodiment of a connector 375 that includes two laterally-positioned mounting tabs 376. Rather than extending into or through the circuit board 200, in some embodiments, the mounting tabs 301 extend parallel to the inner surface 201 of the circuit board 200. The mounting tabs 301 are configured to be mounted to the inner surface 201 through, for example, surface-mount technology (SMT) techniques. For example, a solder joint can be used to mount the mounting tabs 301 to the inner surface 201 of the circuit board 200.

As illustrated, for some embodiments, each mounting tab 301 includes a first extension portion 316, a second extension portion 317, and foot 318. The first extension portion 316 can project laterally away a central plane 391 (see FIG. 2B). The second extension portion 317 can project laterally downward (e.g., proximally or toward the circuit board 200, when connected). The first extension portion 316 and the second extension portion 317 can be oriented, for example, within the same plane. The first extension portion 316 and the second extension portion 317 can extend substantially at right angles to each other (e.g., the first extension portion 316 extends laterally and the second extension portions extends proximally. At a proximal end of the second extension portion 316, the mounting tab 301 can include the foot 318. The foot 318 is oriented to as to be parallel to a plane of the inner surface 201 of the circuit board 200 when connected. The foot 318 is configured to contact and mount to the circuit board 200.

As best seem in FIG. 2B, in the illustrated embodiment, the second extension portion 317 of the mounting tab 301 spaces the main body 311 of the outer shell 310 above the feet 318. This can create a first space 308 below the main body 311 and above the feet 318. The first space 308 can accommodate a flange 336 of the base 303 as discussed below. A second space 309 (see FIGS. 2A and 2C) can be formed between mounting tabs 301 on each lateral side of the main body 301 as shown. The second space 309 can accommodate lateral bodies 305 of the base 303, which are discussed below. For example, as shown, lateral bodies 305 can be positioned within the second space 309 between mounting tabs 301 on each lateral side of the connector 300. In such a position, the lateral bodies 305 can help to transfer moment and torsional forces to the circuit board 200. In some embodiments, the lateral bodies 305 may be in direct physical contact with the first and second extension portions 316, 317 to transfer at least a portion of the moment and torsional forces to the feet 318 (and correspondingly the circuit board 200). Further, positioning the lateral bodies 305 at lateral sides of the connector 300 may provide sufficient space to accommodate the desired number of pins 307 (e.g., 24 pins) within the storage device.

As illustrated in FIGS. 2A-2C, for some embodiments, the connector 300 also includes a base 303, which can be mounted to the circuit board 200. The base 303 can be mounted to the circuit board 200 using, for example, SMT techniques. In the illustrated embodiment, the base 303 includes lateral bodies 305 which extend from opposite sides of the base 303 as shown. The lateral bodies 305 can mount to the inner surface 201 of the circuit board 200.

As illustrated, for some embodiments, lateral bodies 305 project laterally from opposite lateral ends of the base 303. As discussed previously, the lateral bodies 305 are configured to be mounted to the circuit board 200 to provide or strengthen a mechanical connection between the connector 300 and the circuit board 200. In the illustrated embodiment, the lateral bodies 305 comprise generally square or rectangular projections, although other shapes are possible. The lateral bodies 305 can include feet 339 that project downward (e.g., proximally) from the lateral bodies 305. The feet 339 can be configured to contact and mount to the circuit board 200. In some embodiments, the feet 339 space the remainder of the base 303 above the circuit board 200 creating a space 340 between the remainder of the base 303 and the circuit board 200, as shown, for example, in FIG. 2B. In some embodiments, the lateral bodies 305 can include recesses 341 formed into the outer surfaces thereof, as shown, for example, in FIG. 2A.

The connector 300 also includes pins 307 that mount to the inner surface 201 of the circuit board 200. In the illustrated embodiment, the connector 300 includes two rows of pins 307. A first row of pins 307 is positioned on a first side and a second row of pins 307 is positioned on a second side, opposite the first side (see FIG. 2C). In the illustrated embodiment, the connector 300 includes 24 pins 307 total, with 12 pins 307 on each side. In some embodiments, the co-planarity of two rows of pins 307 is within 0.1 mm+/−0.05 mm, 0.1 mm+/−0.025 mm, or 0.1 mm+/−0.01 mm. The pins 307 can be soldered, for example, to the circuit board without open solder, floating pins, or bridging. Other SMT techniques can also be used to connect the pins 307 to the circuit board 200.

As shown, for example, in FIGS. 2A and 2C, in some embodiments, the pins 307 can contact the circuit board 200 at a contact point that is offset from or spaced away from a central location or central plane 392 of the connector 300. In some embodiments, in this position the pins 307 can help resist moment forces between the circuit board 200 and the connector 300. For example, by having a larger foot print (relative to the central location or plane 392) on the circuit board 200 relative to the connector 300 projected onto the circuit board 200 (along a plane 365, as shown in FIG. 2B), the pins 307 can help resist moment forces between the circuit board 200 and the connector 300. For example, in some embodiments, the distal end of the pins 307 is offset from the central location or plane 392 by at least 0.25 mm, 0.5 mm, 0.75 mm, 1.0 mm, 1.5 mm, or 2.0 mm. Extending the pins 307 away from the central location or plane 392 can improve the mechanical stability of the connection between the connector 300 and the circuit board 200.

As shown in FIG. 2B, in some embodiments, no portion of the connector 300 extends below a plane 365. For example, the feet 339 of the mounting tabs 301 of the outer shell 310, the feet 339 of the lateral bodies 305 of the base 303, and the distal ends of the pins 307 all lie in the plane 365. The remainder of the connector 300 can be disposed on a single side of the plane 365. This configuration can allow the connector 300 to be mounted flushly with the circuit board 200 as described above. For example, in some embodiments, when mounted to the circuit board 200, the inner surface 201 of the circuit board also lies in the plane 365 and no portion of the connector 300 extends beyond the plane 365 and into or through circuit board 200.

Further, in some embodiments, only the feet 319 of the mounting tabs 301 of the outer shell 310, the feet 339 of the lateral bodies 305 of the base 303, and/or the distal ends of the pins 307 extend to the plane 365 (and accordingly contact the circuit board 200 when mounted). The remainder of the connector 300, for example, is spaced above plane 365. For example, as shown, the feet 339 of the base 303 create the space 340 which spaces the remainder of the base 303 above the plane 365. Similarly, the second extension portion 317 of the outer shell 310 can space the remainder of the outer shell 310 above the plane 365 creating the first space 308, through which the flanges 336 of the base 303 and the pins 307 can extend.

FIGS. 2A-2C illustrate that, for some embodiments, the connector 300 can flushly attach to the inner surface 201 of the circuit board 200 without extending into or through the circuit board 200, while providing a sufficiently strong mechanical and electrical connection. The mechanical connection between the connector 300 and the circuit board 200 can be formed by the mounting tabs 301, base 303 (e.g., the lateral bodies 305), and/or the pins 307. The electrical connection can be formed by the pins 307. The mounting tabs 301, base 303 (e.g., the lateral bodies 305), and/or the pins 307 can be attached to the inner surface 201 of the circuit board 200 via, for example, SMT or other techniques.

As discussed previously, the feet 319 of the mounting tabs 301 of the outer shell 310, the feet 339 of the lateral bodies 305 of the base 303, and the pins 307 can each be mounted to the circuit board 200, using, for example, SMT techniques, to create mechanical and electrical connections between the connector 300 and the circuit board 200. These features advantageously allow for the connector 300 to be mounted flushly to the circuit board 200 in a perpendicular orientation. This can allow for a storage device 100 using the connector 300 to have a small form factor as described above.

As shown in FIG. 2B, in some embodiments, the mounting tabs 301 and lateral bodies 305 can be spaced laterally from a first central location or plane 391 that bisects the connector 300. In some embodiments, the mounting tabs 301 and lateral bodies 305 are positioned at least 1.0 mm, 2.0 mm, 3.0 mm, or 4.0 mm from the first central location or plane 391. In some embodiments, the mounting tabs 301 and lateral bodies 305 are positioned at lateral-most edges of the connector. Such spacing can provide mechanical stability for the connection between the connector 300 and the circuit board 200, for example, increasing the ability of the connector to resist and/or transfer moments or other forces imparted onto the connector 300 to the circuit board 200 or vice versa. As shown in FIG. 2B, in some embodiments, the lateral bodies 305 can extend laterally beyond the mounting tabs 301.

Further, FIG. 2B illustrates that the flange 336 of the base 303 may contact the top surfaces of the distal ends of the pins 307. Contact between the distal ends of the pins 307 and the flange 336 of the base 303 can further strengthen the mechanical connection between the connector 300 and the circuit board 200. For example, torques or other forces exerted on the pins 307 can be at least partially transferred and/or distributed via contact of the pins 307 and flange 336 into the base 303. As the base 303 may contact the outer shell 310, moments and forces can further be at least partially transferred or distributed into the outer shell 310. Relatedly, forces on the outer shell 310 can be transferred to the pins 307 and then the circuit board 200 in contact with the feet 355. For example, contact between the flange 336 and the pins 307 can at least partially transfer forces on the outer shell 310 and/or the base 303 to the pins 307 (and vice versa as discussed). Further, the pins 307 may contact the circuit board 200 at a position that can be spaced apart from a second central location or plane 392 (see FIG. 2C) to strengthen the connection between the connector 300 and the board 200 against moment forces (e.g., increase the moment arm to decrease the resultant acting forces from use and/or impact on the device).

FIGS. 2B and 2C illustrate example dimensions for the circuit board 200 (e.g., for the illustrated SiP) and mounted connector 300 (e.g., the illustrated USB type-C connector). Again, FIG. 2B is a top view, and FIG. 2C is an inner side view.

The circuit board 200 may comprise a width W, a length L, and a thickness T as shown. The width W, the length L, and the thickness T dimensions described below are configured to provide circuit board 200 and/or the storage device 100 with a small or low-profile form factor. The circuit board 200 having the width W, the length L, and the thickness T dimensions described below can be configured to fit within the housing 101 described above. In some embodiments, dimensions such as, for example, the thickness T may be increased to strengthen overall rigidity and resistance to forces as discussed herein without significantly affecting the small form factor discussed herein. For example, depending on desired mechanical properties and performance of the device, T may be increased from 1.1 mm to 1.8 mm to provide a relatively more robust device that can provide, for example, improved resistance against die crack issues. The circuit board 200 having the width W, the length L, and the thickness T dimensions described below can be a SiP. Further, the connector 300 may have a total height H extending perpendicularly from the circuit board 200 as shown.

In some embodiments, the thickness T may be about 1 mm, 1.5 mm, 2 mm, 2.5 mm. In some embodiments, the thickness T may not exceed about 1 mm, 1.5 mm, 2 mm, and 2.5 mm. In some embodiments, the thickness T is between about 2 mm and 0.5 mm, between 1.5 mm and 0.75 mm between, or between 1.25 mm and 1.0 mm. In an embodiment, the thickness T is about 1.1 mm. Thicknesses T as described above may provide one or more of the advantages mentioned previously (e.g., advantages associated with a small form factor of the storage device 100). By mounting the connector 300, such that it extends perpendicularly (also referred to as vertically) from the circuit board 200 (e.g., as illustrated) the total thickness of the storage device 100 can be limited, such that the storage device does not protrude significantly from an electronic device to which it is connected.

As shown in FIG. 2C, in some embodiments, the length L of the circuit board 200 may be about 18 mm, 16 mm, 14 mm, 12 mm, or 10 mm. In some embodiments, the length L may not exceed about 18 mm, 16 mm, 14 mm, 12 mm, or 10 mm. In some embodiments, the length L is between about 20 mm and 10 mm, between 16 mm and 10 mm, or between 14 mm and 10 mm. In an embodiment, the length L is about 12.5 mm.

In some embodiments, the width W of the circuit board 200 may be about 15 mm, 14 mm, 13 mm, 12 mm, 11 mm, 10 mm, 9 mm, 8 mm, 7 mm, or 6 mm. In some embodiments, the width W may not exceed about 15 mm, 14 mm, 13 mm, 12 mm, 11 mm, 10 mm, 9 mm, 8 mm, 7 mm, or 6 mm. In some embodiments, the width W is between about 15 mm and 7 mm, between 13 mm and 9 mm, between 12 mm and 8 mm. In an embodiment, the width W is about 10 mm. Lengths L and widths W as described above can provide the above-described advantages associated with the small form factor of the storage device 100.

The height H (FIG. 2B) for the connector 300 (measured between the inner surface 201 and the distal end of the connector 300) can be, in some embodiments, about 11 mm, 10 mm, 9 mm, or 8 mm. In some embodiments, the height H may not exceed about 11 mm, 10 mm, 9 mm, or 8 mm. In some embodiments, the height H is between about 11 mm and about 8 mm or between about 10 mm and about 8 mm. In an embodiment, the height H is about 9 mm.

Figure 3:
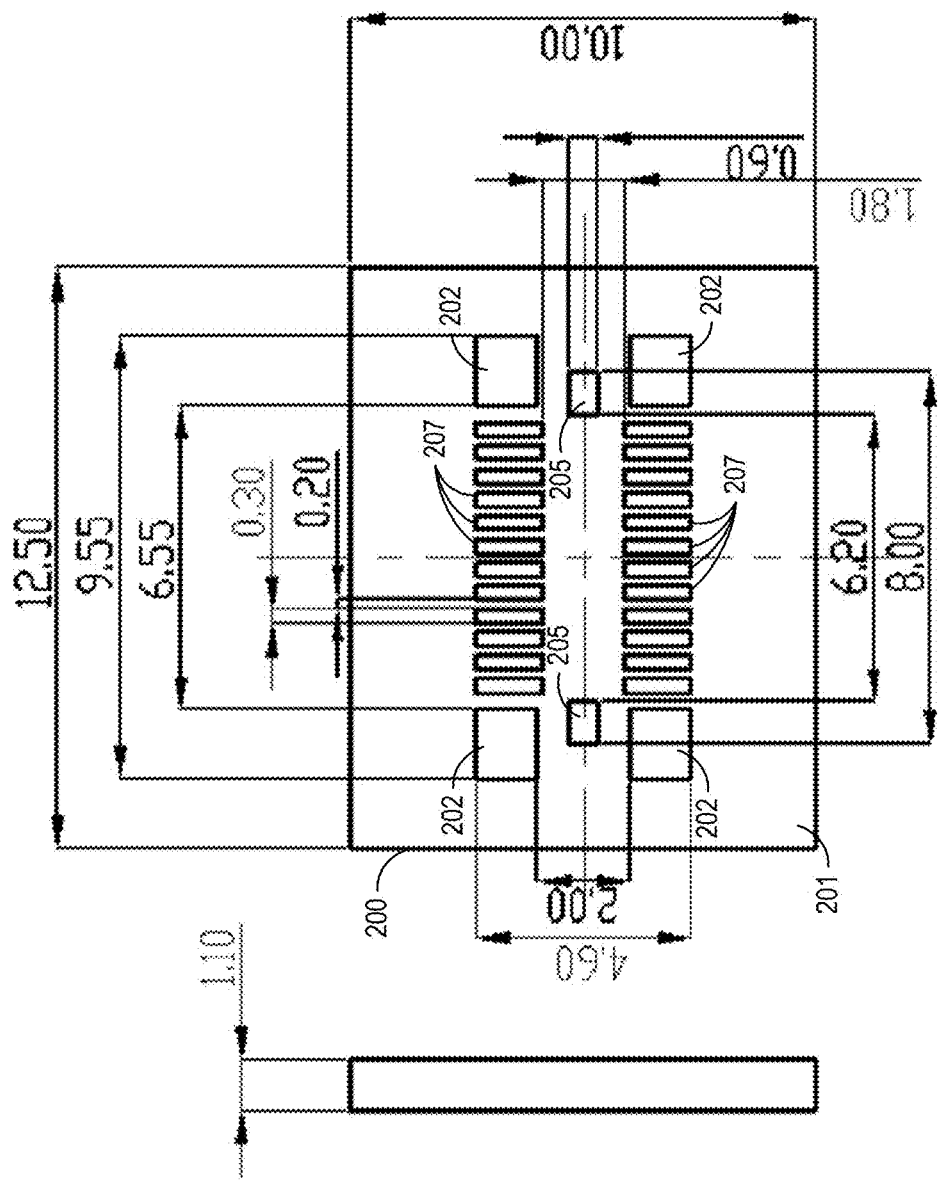
FIG. 3 is a plan view of an embodiment of the circuit board of FIG. 2A.

FIG. 3 is a plan view of an embodiment of the circuit board 200. In the illustrated embodiment, the circuit board 200 is a SiP. The inner surface 201 of the circuit board 200 is illustrated. As illustrated, the circuit board 200 can include a plurality of mounting points 202, 205, 207 positioned on the inner surface 201. In some embodiments, the mounting points 202, 205, 207 comprise solder pads formed on the inner surface 201.

The mounting points 202, 205, 207 may be configured to connect, attach, or mount to the connector 300. For example, mounting points 202 can be configured in size, shape, and position to connect to the mounting tabs 301. The mounting points 205 can be configured in size, shape, and position to connect to the lateral bodies 305 of the base 303. The mounting points 207 can be configured to connect to the pins 307. When the mounting points 202, 205, 207 are attached to corresponding structure on the connector 300, a mechanical connection between the circuit board 200 and the connector 300 is formed. Additionally, connection between the mounting points 207 and the pins 307 can establish an electrical connection between the pins 307 of the connector and components of the circuit board 200.

FIG. 3 illustrates example dimensions and locations of the mounting points 202, 205, 207 according to one embodiment. Other dimensions and locations for the mounting points 202, 205, 207 are possible.

Figure 4:
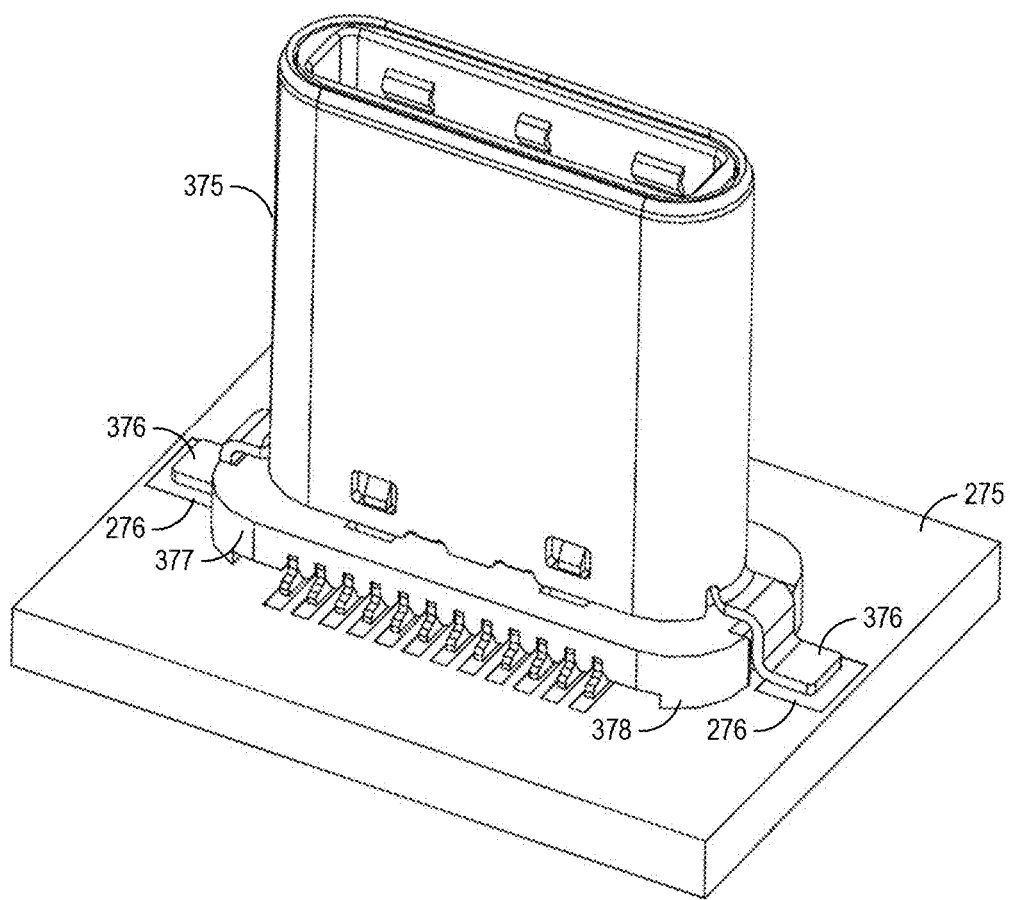
FIG. 4 is an isometric view of an embodiment of a connector for a storage device mounted to a circuit board.

FIG. 4 is an isometric view of another embodiment of a connector 375 for a storage device 100 mounted to a circuit board 275. In many respects, the connector 375 and circuit board 275 are similar to the connector 300 and circuit board 200 described above. For example, the connector 375 can be a USB type-C connector, and the circuit board 275 can be a SiP. The connector 375 and circuit board 275 can be configured for use in a storage device 100 having a small form factor, providing the advantages discussed above. The storage device 100 may include a housing as described above that provides adequate heat dissipation for the storage device 100.

As shown in FIG. 4, the connector 375 includes a base 377. The base 377 can include a flange 378 that extends around the periphery of the connector 300. The flange 378 of the base 377 can provide a surface area for attaching the connector 375 to the circuit board 275. The flange 378 of the base 377 can distribute forces exerted onto the connector 375 over a surface area of the circuit board 275 to provide a strengthened mechanical connection between the connector 375 and the circuit board. For example, by having a larger foot print on the circuit board 275 relative to the connector 375 projected onto the circuit board 275, the base 377 can help resist moment forces between the circuit board 275 and the connector 375, including at least partially via the feet 355 of the pins 307 as discussed herein.

The connector 375 can also include two laterally-positioned mounting tabs 376. The mounting tabs 376 can be configured to attach to corresponding mounting points 276 on the circuit board 275. As shown in FIG. 5, the mounting tabs 376 can extend from the connector 300, over the flange 378 of the base 377 and attach to the circuit board 200.

The connection between the mounting tabs 376 and/or the base 377 and the circuit board 275 can provide a mechanical connection between the connector 375 and the circuit board 275 that withstands the forces exerted on the storage device 100 during common use. The features described above can advantageously provide a sufficiently strong connection even though the connector 375 is mounted flushly to the circuit board 275.

In some embodiments, the present disclosure generally relates to, for example, a type-C USB (Universal Serial Bus) memory drive or storage device with small size. The storage device can be configured for plug and stay use. The storage device can include one or more of the following: a USB type-C connector with leads extending along the direction of insertion of the storage device; a USB SiP (System-In-Package) or other type of circuit board positioned within a housing, a BGA (Ball Grid Array) in which the memory dies, controller die(s) and spacer are stacked, and on one side of which the BGA is formed for connections to type-C connector and passive components; an interface PCB (Printed Circuit Board) with simple and thin design, on a first side of which the passive components from the USB SiP are mounted, on a second side of which arrays of solder balls are formed corresponding to the configuration of the USB SiP BGA, and through which through-holes may be formed corresponding to the leads of the type-C connector; a top lid and a bottom lid covering above components; wherein, the type-C connector is reflowed perpendicularly to the interface PCB with its leads passing through the through-holes in the interface PCB, and the interface PCB has the same width and length with the SiP module. In some embodiments, the SiP does not include through-holes and the connector is mounted flushly to the SiP as described above.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the disclosure should not be taken to imply that the terminology is being re-defined herein to be restricted to including any specific characteristics of the features or aspects of the technology with which that terminology is associated.

It will be appreciated by those skilled in the art that various modifications and changes can be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures can be combined, interchanged or excluded from other embodiments.

With respect to the use of substantially any plural and/or singular terms herein, those having skill in the art can translate from the plural to the singular and/or from the singular to the plural as is appropriate to the context and/or application. The various singular/plural permutations can be expressly set forth herein for sake of clarity.

Directional terms used herein (e.g., top, bottom, side, up, down, inward, outward, etc.) are generally used with reference to the orientation shown in the figures and are not intended to be limiting. For example, the top surface described above can refer to a bottom surface or a side surface. Thus, features described on the top surface may be included on a bottom surface, a side surface, or any other surface.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims can contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The term "comprising" as used herein is synonymous with "including," "containing," or "characterized by," and is inclusive or open-ended and does not exclude additional, unrecited elements or method steps.

The above description discloses several methods and materials of the present invention(s). This invention(s) is susceptible to modifications in the methods and materials, as well as alterations in the fabrication methods and equipment. Such modifications will become apparent to those skilled in the art from a consideration of this disclosure or practice of the invention(s) disclosed herein. Consequently, it is not intended that this invention(s) be limited to the specific embodiments disclosed herein, but that it cover all modifications and alternatives coming within the true scope and spirit of the invention(s) as embodied in the attached claims.

What is claimed is:

1. A storage device comprising:
a circuit board configured to store data, the circuit board including an inner surface;
a housing enclosing the circuit board, the housing including an inner surface and an outer surface, the outer surface opposite the inner surface of the housing, the inner surface of the circuit board at least partially between the inner and outer surfaces of the housing, wherein both the inner and outer surfaces of the housing face outwardly away from the circuit board; and
a connector mounted perpendicularly to the inner surface of the circuit board and extending through an aperture of the inner surface of the housing, the connector configured to electrically connect to an electronic device to transfer data between the storage device and the electronic device,
wherein a thickness of the housing, measured between the inner surface of the housing and the outer surface of the housing, does not exceed 6 millimeters (mm).

2. The storage device of claim 1, wherein the circuit board comprises a system-in-package (SiP).

3. The storage device of claim 1, wherein:
a thickness measured between the inner surface of the circuit board and an opposite outer surface of the circuit board does not exceed 2 mm;
a width of the circuit board does not exceed 12 mm; and
a length of the circuit board does not exceed 15 mm.

4. The storage device of claim 1, wherein:
the thickness of the circuit board is about 1.1 mm;
the width of the circuit board is between about 7 mm and about 9 mm; and
the length of the circuit board is between about 12 mm and 13 mm.

5. The storage device of claim 1, wherein:
a width of the housing does not exceed 14 mm; and
a length of the housing does not exceed 18 mm.

6. The storage device of claim 1, wherein:
the thickness of the housing is about 4.3 mm;
the width of the housing is about 11.7 mm; and
the length of the housing is about 14.5 mm.

7. The storage device of claim 1, wherein:
the connector is mounted flushly to the inner surface of the circuit board; and
no portion of the connector extends into or through the circuit board.

8. The storage device of claim 1, wherein the housing comprises:
an inner housing member including the inner surface of the housing and the aperture such that the inner housing member at least partially surrounds the connector extending through the aperture, wherein the inner housing member comprises a heat conductive material configured to transfer heat; and an outer housing member including the outer surface of the housing.

9. The storage device of claim 8, wherein the outer housing member comprises a heat insulative material configured to mitigate heat transfer relative to the heat conductive material.

10. The storage device of claim 8, wherein the inner housing member is configured to directly contact a surface of the electronic device with the connector electrically connected to the electronic device to provide heat transfer between the inner housing member and the electronic device.

11. The storage device of claim 1, wherein the connector comprises a universal serial bus (USB) type-C connector.

12. The storage device of claim 1, wherein the inner surface of the housing is heat conductive, and wherein a length of a portion of the connector extending through the aperture of the inner surface of the housing is sized to allow the inner surface of the housing to contact the electronic device when the electronic device is connected to the connector, thereby allowing heat to transfer from the inner surface of the housing to the electronic device for dissipation.

13. A method for manufacturing a storage device, the method comprising:
   mounting a connector to an inner surface of a circuit board such that the connector extends perpendicularly from the inner surface; and
   enclosing the circuit board within a housing comprising a heat conductive inner housing member and an outer housing member such that the connector extends through an inner surface of the inner housing member;
   wherein a length of the connector as measured from an outer surface of the inner housing memory is sized to allow the outer surface of the inner housing memory to contact an electronic device connected to the connector, thereby allowing heat to transfer from the heat conductive inner housing member to the electronic device for dissipation.

14. The method of claim 13, wherein mounting the connector comprises mounting the connector flushly to the inner surface of the circuit board such that no portion of the connector extends into or through the circuit board.

15. The method of claim 13, wherein mounting the connector comprises attaching mounting tabs of the connector to mounting points on the inner surface of the circuit board.

16. The method of claim 13, wherein mounting the connector comprises attaching lateral bodies of a base of the connector to mounting points on the inner surface of the circuit board.

17. The method of claim 13, wherein a thickness of the housing, measured between the inner surface of the housing and an outer surface of the housing, does not exceed 6 millimeters (mm).

18. The method of claim 13, wherein the circuit board comprises a system-in-package (SiP).

19. The method of claim 13, wherein the connector comprises a universal serial bus (USB) type-C connector.

20. The method of claim 13, wherein the outer housing member comprises a heat insulative material.

21. A storage device comprising:
   a storing means for storing data, the storing means comprising an inner surface;
   a housing means for housing the storing means; and
   a connector means for connecting to an electronic device to transfer data between the storing means and the electronic device, the connector means mounted perpendicularly to the inner surface of the storing means by an attachment means, the connector means extending through an aperture of the housing means,
   wherein a thickness of the housing means, measured between an inner surface of the housing means and an outer surface of the housing means, is no more than 6 millimeters (mm).

22. The storage device of claim 21, wherein the inner surface of the housing is heat conductive, and wherein a length of a portion of the connector extending through the aperture of the inner surface of the housing is sized to allow the inner surface of the housing to contact the electronic device when the electronic device is connected to the connector, thereby allowing heat to transfer from the inner surface of the housing to the electronic device for dissipation.

* * * * *